United States Patent
Koyama et al.

(10) Patent No.: US 6,829,178 B2
(45) Date of Patent: Dec. 7, 2004

(54) NONVOLATILE MEMORY DEVICE

(75) Inventors: Hiyori Koyama, Ome (JP); Kazuyoshi Oshima, Ome (JP); Akihiko Hoshida, Akiruno (JP); Kiichi Manita, Kawagoe (JP); Michitaro Kanamitsu, Ome (JP); Shinji Udo, Higashiyamato (JP); Kazue Kikuchi, Ootsu (JP); Kazuaki Ujiie, Mitaka (JP); Masahiro Sakai, Akishima (JP)

(73) Assignees: Renesas Technology Corp., Tokyo (JP); Hitachi ULSI Systems Co., Ltd., Tokyo (JP)

(*) Notice: Subject to any disclaimer, the term of this patent is extended or adjusted under 35 U.S.C. 154(b) by 38 days.

(21) Appl. No.: 10/269,971

(22) Filed: Oct. 15, 2002

(65) Prior Publication Data

US 2003/0107918 A1 Jun. 12, 2003

(30) Foreign Application Priority Data

Oct. 31, 2001 (JP) ........................................ 2001-334660

(51) Int. Cl.$^7$ ................................................ G11C 7/00
(52) U.S. Cl. .................. 365/189.07; 365/236; 365/218; 365/189.01; 365/189.03; 365/189.29
(58) Field of Search ............................ 365/189.07, 236, 365/218, 189.01, 189.03, 189.09

(56) References Cited

U.S. PATENT DOCUMENTS

| | | | | |
|---|---|---|---|---|
| 6,504,764 B2 | * | 1/2003 | Tsujikawa et al. | 365/185.28 |
| 6,504,773 B2 | * | 1/2003 | Kobayashi | 365/201 |
| 6,643,180 B2 | * | 11/2003 | Ikehashi et al. | 365/185.22 |
| 6,665,214 B1 | * | 12/2003 | Cheah et al. | 365/185.22 |
| 2001/0052093 A1 | * | 12/2001 | Oshima et al. | 714/719 |
| 2002/0031026 A1 | * | 3/2002 | Kobayashi | 365/201 |
| 2002/0054528 A1 | * | 5/2002 | Tabata et al. | 365/218 |
| 2002/0069381 A1 | * | 6/2002 | Jeong et al. | 714/704 |

FOREIGN PATENT DOCUMENTS

JP 411096792 A * 4/1999 ........... G11C/29/00

* cited by examiner

Primary Examiner—Viet Q. Nguyen
(74) Attorney, Agent, or Firm—Miles & Stockbridge P.C.

(57) ABSTRACT

A counter circuit for counting the number of fails generated during the write and erase processes executed in the predetermined unit such as a sector and a comparison circuit for judging whether the value counted with the counter circuit has exceeded or not the preset allowable value for the number of fails are provided. Accordingly, when the counted value of the counter circuit has exceeded the allowable value set to a register, the write process or erase process is not performed even when a write or erase command is inputted from an external circuit. Thereby, the required test time can be shortened for the electrically programmable and erasable nonvolatile semiconductor memory device such as a flash memory.

6 Claims, 11 Drawing Sheets

FIG. 8(A)
PASSED SECTOR
FIG. 8(B)
SECTOR INCLUDING A FALL BIT
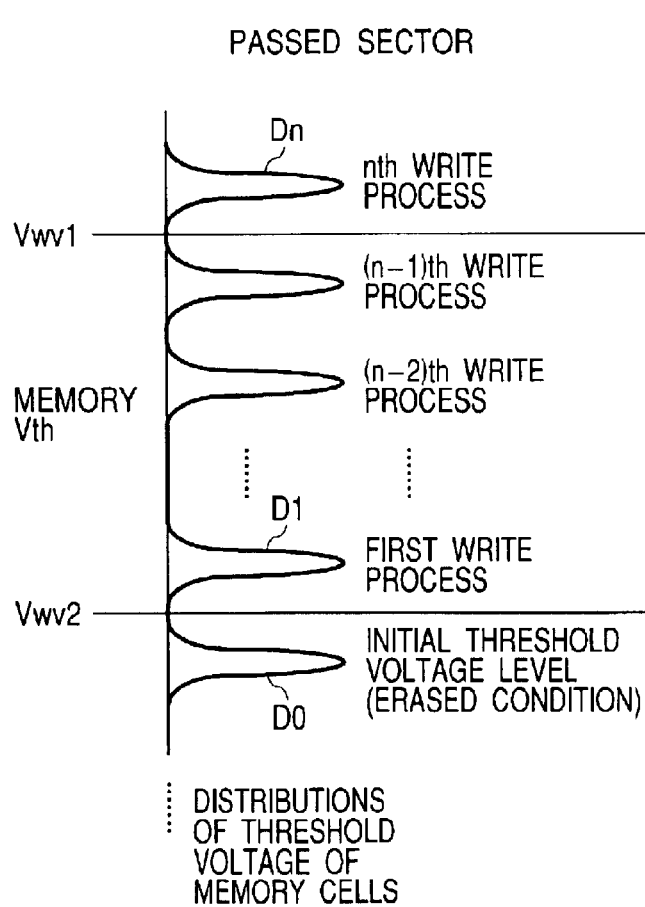
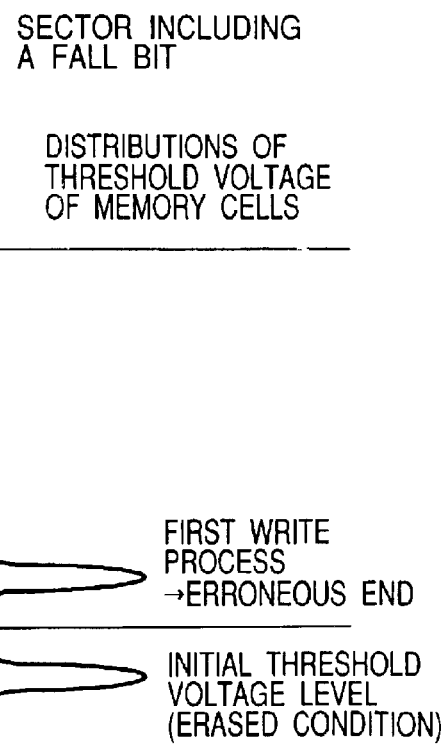

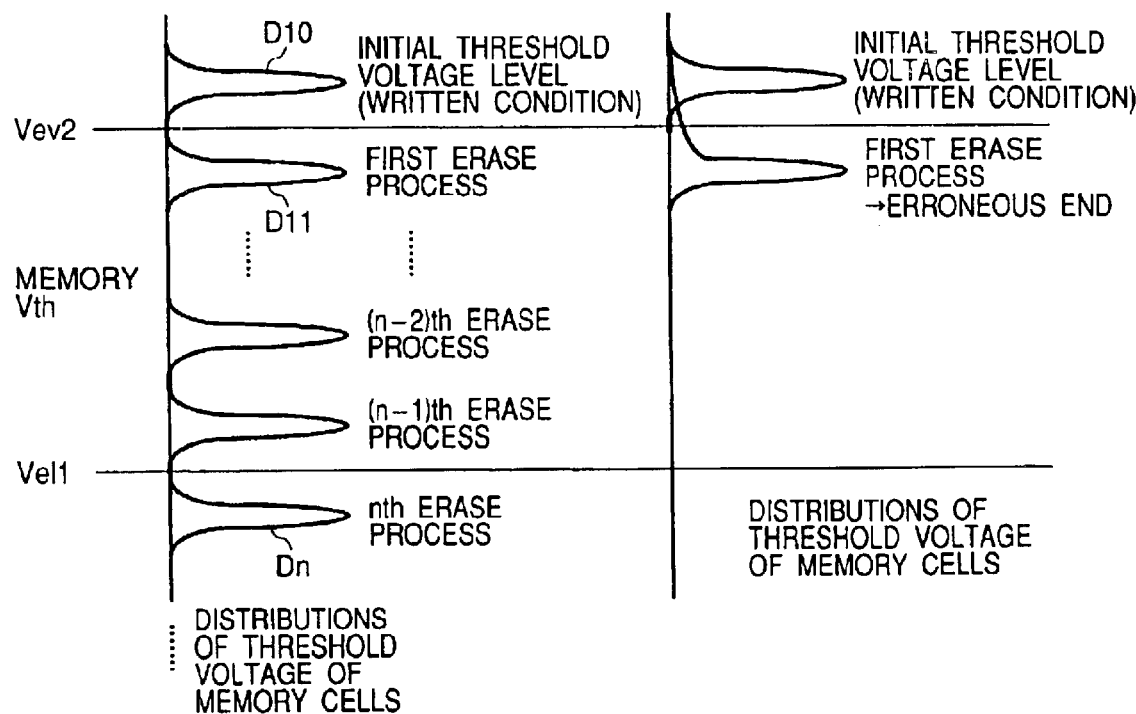

NONVOLATILE MEMORY DEVICE

BACKGROUND OF THE INVENTION

The present invention relates to a technique for testing a nonvolatile memory device which can electrically write and erase storing information and more specifically to a technique which can be effectively applied for shortening of the time required for the test, for example, a technique which can be effectively applied to a flash memory.

A flash memory utilizes a nonvolatile memory element, into a memory cell, consisting of a MOSFET of a double-gate structure including a control gate and a floating gate. This flash memory is capable of storing information by changing a threshold voltage of the MOSFET depending on change of the amount of charges accumulated in the floating gate.

In such flash memory, a threshold voltage changes in various manners due to the write or erase processes to a memory cell and normal write or erase process sometimes becomes impossible, for example, due to a fault such as fail of insulation film of MOSFET which forms a memory cell. In other words, a threshold voltage does not change in some cases even when the write or erase process is executed.

In the case of performing the write process in unit of memory cells (hereinafter, referred to as a sector) connected to only one word line, a flash memory has been placed under the control as a means in response to fluctuation of characteristics of memory cells that the write process is conducted through division into a plurality of write processes and a write voltage is never applied from the memory cells which have reached the predetermined threshold voltage. Moreover, the conventional flash memory has also been placed under the control that existence of fail bit is detected by a test of wafer level with a tester and management is also executed in unit of a sector, a sector including a fail bit is defined as a defective sector and information to discriminate fail and pass is stored in the sector management area and thereby the defective sector is never selected under the usual using condition by utilizing this management information.

SUMMARY OF THE INVENTION

For the test to detect a write fail bit or an erase fail bit, a test system is introduced to enhance the test efficiency in which the test of a plurality of chips is executed in parallel by bring the probe of tester into contact with a plurality of chips in the wafer condition.

As explained above, a method for simultaneously testing a plurality of chips in the wafer condition is certainly effective for an ordinary semiconductor integrated circuit. However, in the case of a flash memory, since the write process, for example, is conducted in a plurality of times of the write process as explained above, if a fail bit exists, in other words, a bit which does not or almost does not change its threshold voltage exists in the sector selected by a certain chip, the write process is ended using a longer period due to the existence of such fail bit and transfer to the next sector is not yet started during such period even when the write process of the present sector is completed in the other chips in which the sectors are normal.

Namely, the conventional tester which can simultaneously test a plurality of chips in the wafer condition is capable of moving a probe for each chip and therefore the testing time thereof is controlled depending on a chip including a fail sector. Therefore, such tester has a problem that the number of chips to be tested simultaneously cannot be increased too much because there is a fear that if the number of chips for simultaneous test is increased, probability that the selected sectors of a certain chip are fail sectors becomes high and thereby the testing time becomes longer. As explained above, in the existing flash memory and a method of testing the same, a test requires a higher cost because a longer time is required for the test and such higher testing cost has been considered as a factor which disables reduction in cost of chip.

It is therefore an object of the present invention to provide a testing technique which can shorten the testing time and thereby can reduce a unit price of chip in a nonvolatile semiconductor memory device which can realize electrical write or erase processes such as a flash memory.

The aforementioned and the novel characteristics of the present invention will become apparent from the description of the present specification and the accompanying drawings.

Typical ones of the inventions disclosed in the present specification will be explained as follows.

Namely, the first invention of the present specification provides a nonvolatile semiconductor memory device such as a flash memory comprising: a counter circuit for counting the number of fails generated in the write and erase processes in the predetermined unit like a sector; and a comparing circuit for judging whether a value counted by the counter circuit has exceeded a limit value (allowable value) of the preset number of fails or not so that when a counted value of the counter circuit has exceeded the preset limit value of a register, the writer or erase process is not conducted even if a write or erase command is inputted from an external circuit.

According to the means explained above, if the number of fail sectors has exceeded the limit value in any memory among a plurality of memories to be tested simultaneously, the write or erase process is not executed even if the write or erase command is inputted from an external circuit. Therefore, the test of the relevant chip is completed when the number of fail sectors has exceeded the limit value and thereafter this memory can prevent elongation of the write time or erase time and can shorten the total testing time.

Moreover, the other invention disclosed in the present specification provides a nonvolatile semiconductor memory device such as a flash memory having a structure that a storage area (pass/fail flag) for storing generation of a fail in the write and erase process in the predetermined unit such as a sector is provided and when information indicating generation of a fail is stored in the storage area, the write or erase process is not executed in the test mode for the corresponding sector within the memory array. Thereby, it is now possible that the write or erase process can be stopped for the sector for which the information indicating generation of fail is stored in the corresponding storage area by checking the storage area in the second and subsequent tests and the total testing time can be shortened.

The other invention disclosed in the present specification provides a nonvolatile semiconductor memory device comprising a memory array including a nonvolatile memory element which is provided with a control gate and a floating gate to store information through change of the threshold voltage. This nonvolatile semiconductor memory device has a structure to perform the read process for verification during the test operation in the level which is relatively lower than the level for the read process for verification under the usual operating condition and also to complete the relevant write or erase process when it is judged that a fail is generated in the write or erase process with the read process for verification during the test operation under the lower level explained above.

Accordingly, on the occasion of performing the write or erase process by repeating the applications of a write voltage or an erase voltage, when a threshold voltage does not change exceeding the predetermined level even if the initial write voltage or erase voltage is applied, the write or erase process can be completed upon judgment that a fail bit is included. As a result, repetition of useless process can be prevented and thereby a total testing time can be shortened.

BRIEF DESCRIPTION OF THE DRAWINGS

FIG. 8 is a diagram illustrating relationship between a level of read process for verification and a threshold voltage distribution of memory cells of the flash memory to which the third embodiment of the present invention is applied.

FIG. 11(A) and FIG. 11(B) are two diagrams illustrating relationship between a level of erase process for verification and a threshold voltage distribution of memory cells of the flash memory to which the third embodiment of the present invention is applied.

DETAILED DESCRIPTION OF THE PREFERRED EMBODIMENTS

The preferred embodiments of the present invention will be explained with reference to the accompanying drawings.

Figure 1:
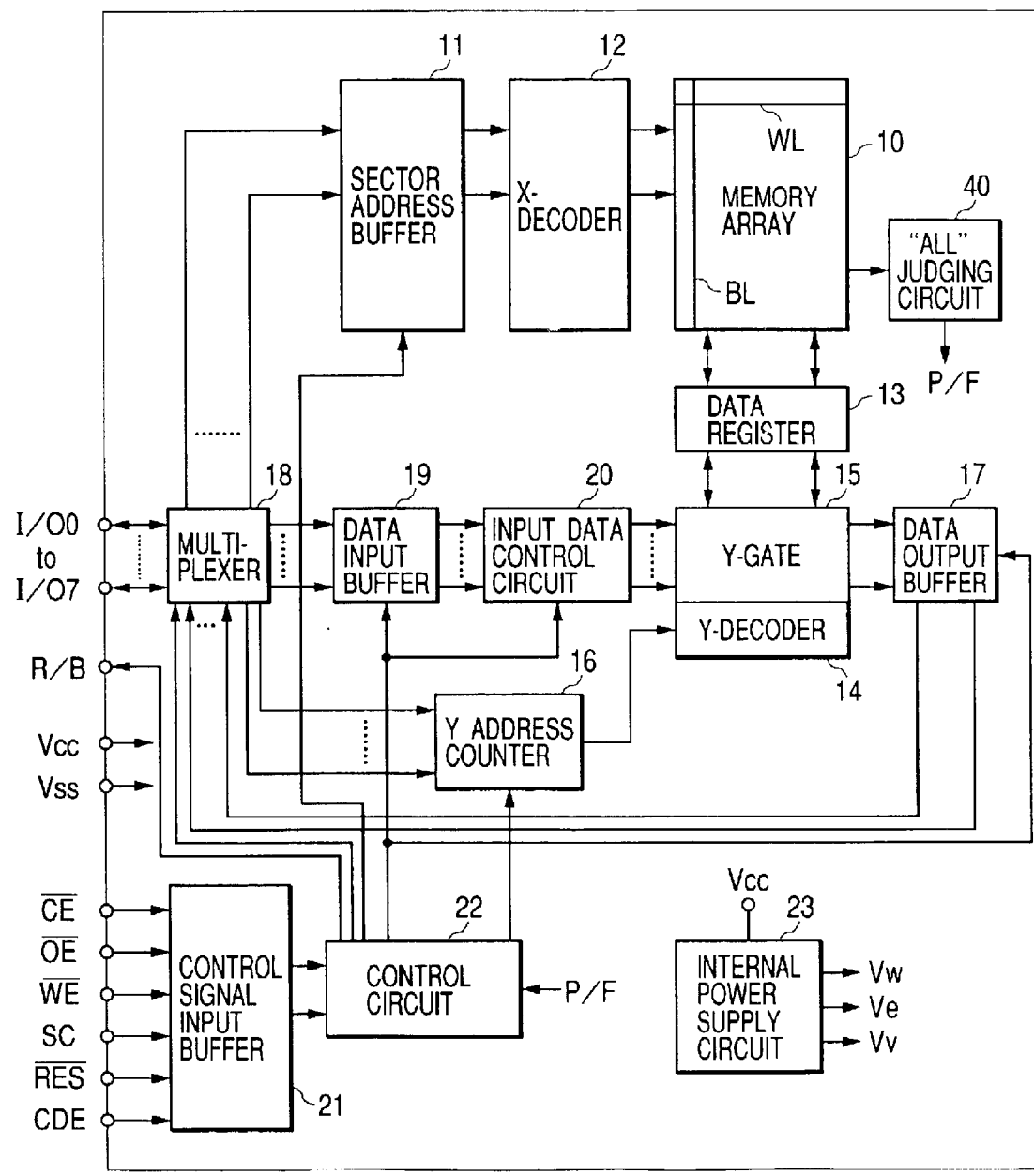
FIG. 1 is a block diagram illustrating an embodiment of a flash memory as an example of a nonvolatile semiconductor memory device to which the present invention can effectively be applied.

FIG. 1 is a block diagram of an embodiment of a flash memory as an example of a nonvolatile semiconductor memory device to which the present invention can be applied effectively. A flash memory also comprehends a multiple level memory which can store the data of two or more bits within only one memory cell. The flash memory of this embodiment is structured as a binary level memory which can store the data of one bit to only one memory cell and is formed on one semiconductor chip such as a single crystal silicon.

In FIG. 1, the reference numeral 10 designates a memory array in which a plurality of nonvolatile memory elements (memory cells) are arranged in the shape of a matrix; 11, a sector address buffer for fetching sector addresses (K address) supplied from an external circuit; 12, an X-decoder, including a word driver circuit to drive a word line WL to the selection level, for selecting one word line within the memory array 10 by decoding the sector address; 13, a data register connected to the bit line BL within the memory array 10 to hold a write data and amplify and latch a readout signal; 14, a Y-decoder (Y-DEC) for generating a signal to select the bit line by decoding a Y-address; 15, a Y-gate (column switch) for connecting the data register 13 with a selection signal generated by the Y-decoder 14.

Moreover, the reference numeral 16 designates a Y-address counter for generating a continuous column address (Y-address) by executing a counting operation with a clock signal supplied from an external circuit. The Y-address generated is then supplied to the Y-decoder 14 to sequentially select the bit lines in the memory array 10 when the corresponding Y-gate 15 is made conductive. The data which is read from the memory array 10 when the data is read is then outputted, by a data output buffer 17, to an external circuit from data input/output terminals I/O 0 to I/O 7 via a multiplexer 18. A write data inputted to the input/output terminals I/O 0 to I/O 7 from an external circuit when the data is read is then supplied, with the multiplexer 18, to an input data control circuit 20 via a data input buffer 19 and is then supplied to the bit lines in the memory array 10 selected via the Y-gate 15 from this input data control circuit 20.

Moreover, the flash memory of this embodiment is also provided, although not particularly restricted, with a control signal buffer 21 for fetching a plurality of control signals supplied from an external microprocessor and a control circuit (controller) 22 for sequentially forming a control signal and then outputting this control signal to each circuit in the memory for interpret a command code (instruction code) and then executing the processes corresponding to the relevant command code (hereinafter referred to only as command).

The controller 22 is provided, for example, with a command data to form a control signal for each circuit within the chip by decoding the command in order to automatically execute the corresponding processes by decoding the command when this command is given via the data input/output terminals I/O 0 to 7. Moreover, the controller 22 is also provided with a status register having the bits for indicating pass or fail of write or erase process and this status register outputs contents thereof to the external side of chip from the data input/output terminals I/O 0 to 7.

Moreover, the flash memory of this embodiment is also provided with an internal power supply circuit 23 consisting of an internal voltage generating circuit to generate a write voltage Vw, an erase voltage Ve and verification voltages Vwv, Vev required for the memory array 10 and X-decoder 12 based on the power supply voltage Vcc supplied from the external circuits and a reference power supply circuit to generate the reference voltage required to generate the predetermined voltage with this internal voltage generating circuit.

The control signal inputted to the flash memory of this embodiment from an external CPU or the like includes, for example, a reset signal/RES, chip selection signal/CE, write control signal/WE, output control signal/OE, command enable signal CDE indicating the command or data input or address input, and system clock SC, etc. The address and data or command are respectively fetched to the sector buffer circuit 11 or data input buffer circuit 19 or controller 22 through the switching of the multiplexer 18 depending on an internal control signal outputted from the controller 22, for example, based on the command enable signal CDE. Here, although not particularly restricted, the signal given the sign "/" before the code becomes the effective level when it is in the low level. Moreover, the controller 22 outputs, to the external side of chip, a ready/busy signal R/B indicating whether it is possible or not to input the command to the chip.

Figure 2:
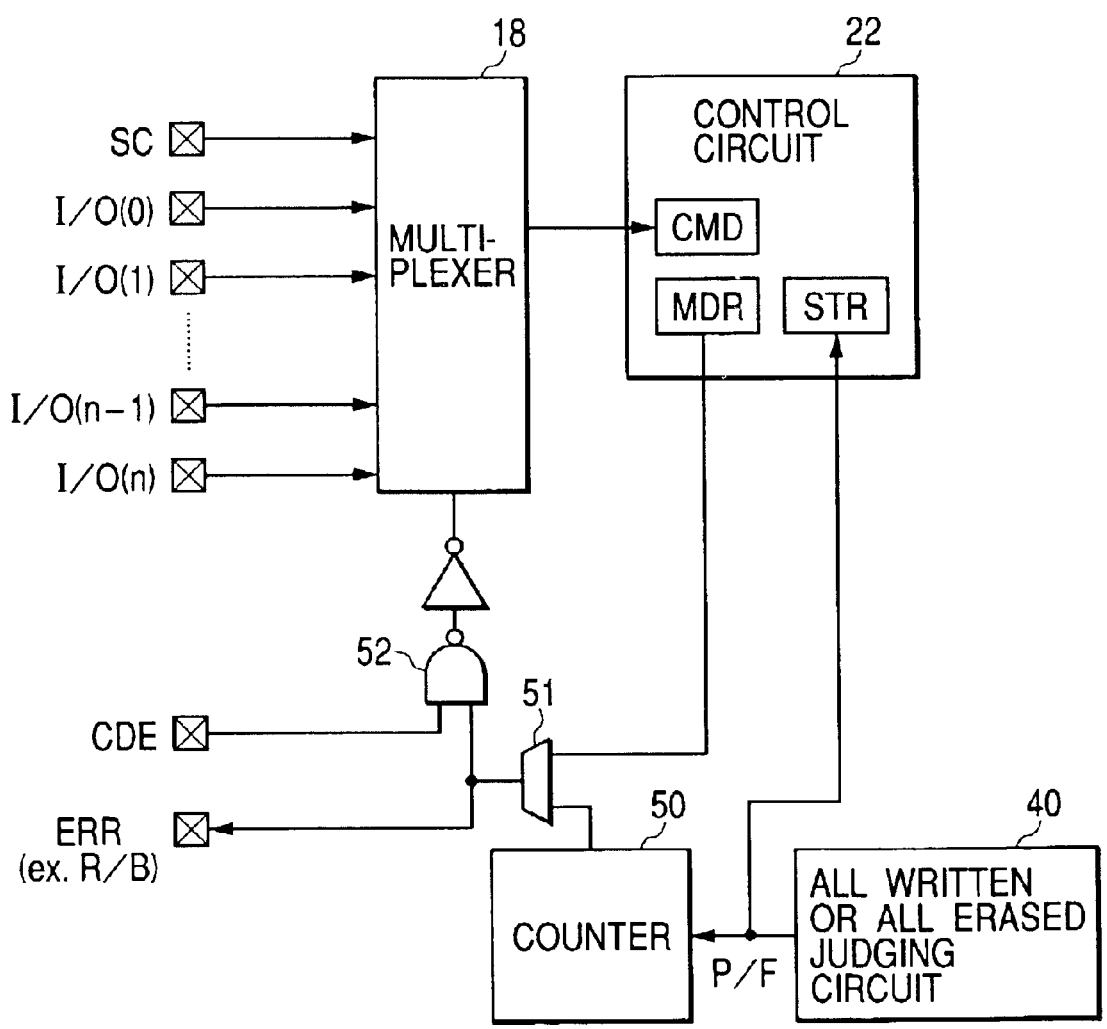
FIG. 2 is a block diagram illustrating a schematic structure of the essential portion of an embodiment of the flash memory to which the present invention is applied.

FIG. 2 is a schematic structural diagram illustrating the essential portion of an embodiment of the flash memory to which the present invention is applied. In this figure, the code CMD designates a command decoder for decoding a command (instruction) given from an external microprocessor, while STR, a status register indicating the internal condition and MDR, a mode register. The command decoder CMD forms a part of the controller 22 and the command supplied to the input/output terminals I/O 0 to 7 from the external circuits is fetched to the command decoder CMD via the multiplexer 18 when a command enable signal CDE is set, for example, to the high level. Table 1 illustrates a bit format of the status register STR.

TABLE 1

|    | Definition    | "0"  | "1"  |
|----|---------------|------|------|
| B7 | Ready/Busy    | Busy | Ready |
| B6 | Reserved      | —    | —    |
| B5 | Erase Check   | Pass | Fail |
| B4 | Program Check | Pass | Fail |
| B3 | Reserved      | —    | —    |
| B2 | Reserved      | —    | —    |
| B1 | Reserved      | —    | —    |
| B0 | Reserved      | —    | —    |

The status register STR of this embodiment is formed of 8 bits of the bit B7 to bit B0. The bit B7 of these 8 bits indicates the internal condition of chip (hereinafter referred to as R/B bit), the bit B5 indicates the result of erase process (erase check bit), the bit B4 indicates the result of write process (write check bit) and the bits B6 and the bits B3 to B0 are auxiliary bits.

In more practical, when the bit B7 is logical "0", it indicates that the chip is in the write or erase operating condition and an access to the chip from the external circuit is impossible. When the bit B7 is logical "1", it indicates that the inside of chip is in the waiting condition and access from the external side is possible. Moreover, when the bit B5 is logical "0", it indicates that the erase process is completed normally and when the bit B5 is logical "1", it indicates that the erase process is completed erroneously. Moreover, when the bit B4 is logical "0", it indicates that the write process is completed normally and when the bit B4 is logical "1", it indicates that the write process is completed erroneously.

The status of R/B bit B7 among the bits B7 to B0 of the status register STR is always outputted from the external terminal and all status of the bits B7 to B0 are outputted from the input/output terminals I/O 7 to I/O 0 when the chip enable signal and out enable signal supplied from the external circuit are asserted to the low level. In addition, the bits B7 to B0 of the status register 15 are sequentially set with the chip controller 22 depending on each control condition.

Moreover, the flash memory of this embodiment automatically starts, when a write command or erase command is inputted from an external circuit for example, the write or erase process within the chip in response to the controller 22 and sets, when such process is completed, a write error bit (B4) or an erase error bit (B5) indicating the pass or fail in the status register STR.

The reference numeral 40 designates an all written or all erased judging circuit indicating whether all memory cells of a sector provided incorporation to the memory array 10 are written or erased normally or not. With a judging signal P/F outputted from the all written or all erased judging circuit 40, a write error bit or erase error bit is set to indicate pass or fail of the status register STR.

In this embodiment, a counter circuit 50 for counting up the number of times of fail, namely number of fail sectors based on the judging signal P/F outputted from this all written or all erased judging circuit 40, a comparison circuit 51 for comparing the counted value of the counter circuit 50 with the limit value which is previously given from the external circuit and a NAND gate circuit 52 for inhibiting the input of the command enable signal CDE with an output signal of the comparison circuit 51. Moreover, the controller 22 is also provided with an area, within the mode register MDR, to hold the limit value given from the external circuit. In addition, in this embodiment, when the comparison circuit 51 judges that the counted value of the counter circuit 50 has reached the limit value previously given from the external circuit, a signal ER indicating that the number of fail sectors has reached the limit value is outputted from the predetermined external terminal (for example, ready/busy terminal R/B).

Figure 3:
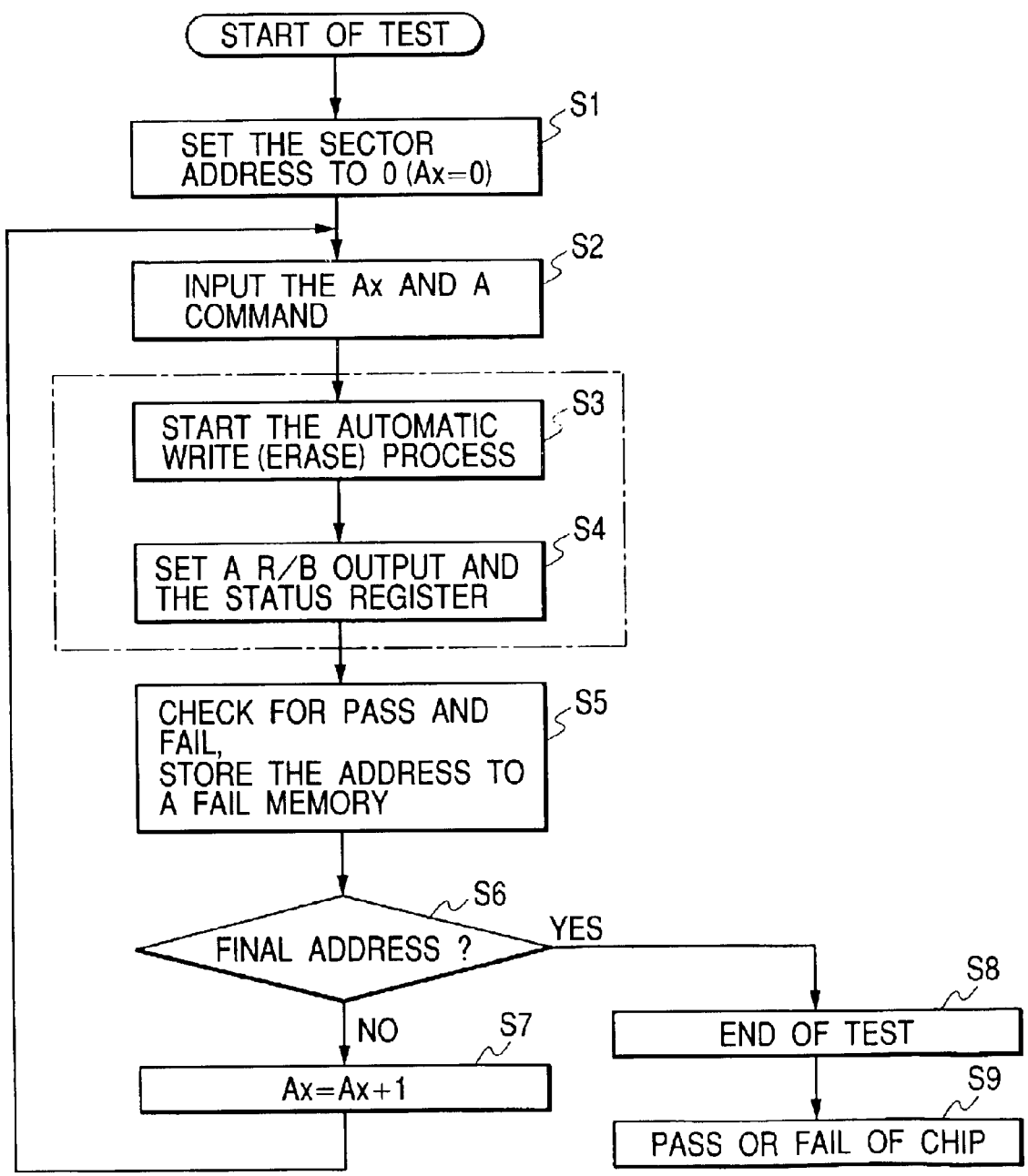
FIG. 3 is a flowchart illustrating an example of procedures of a testing method in the existing flash memory.
Figure 4:
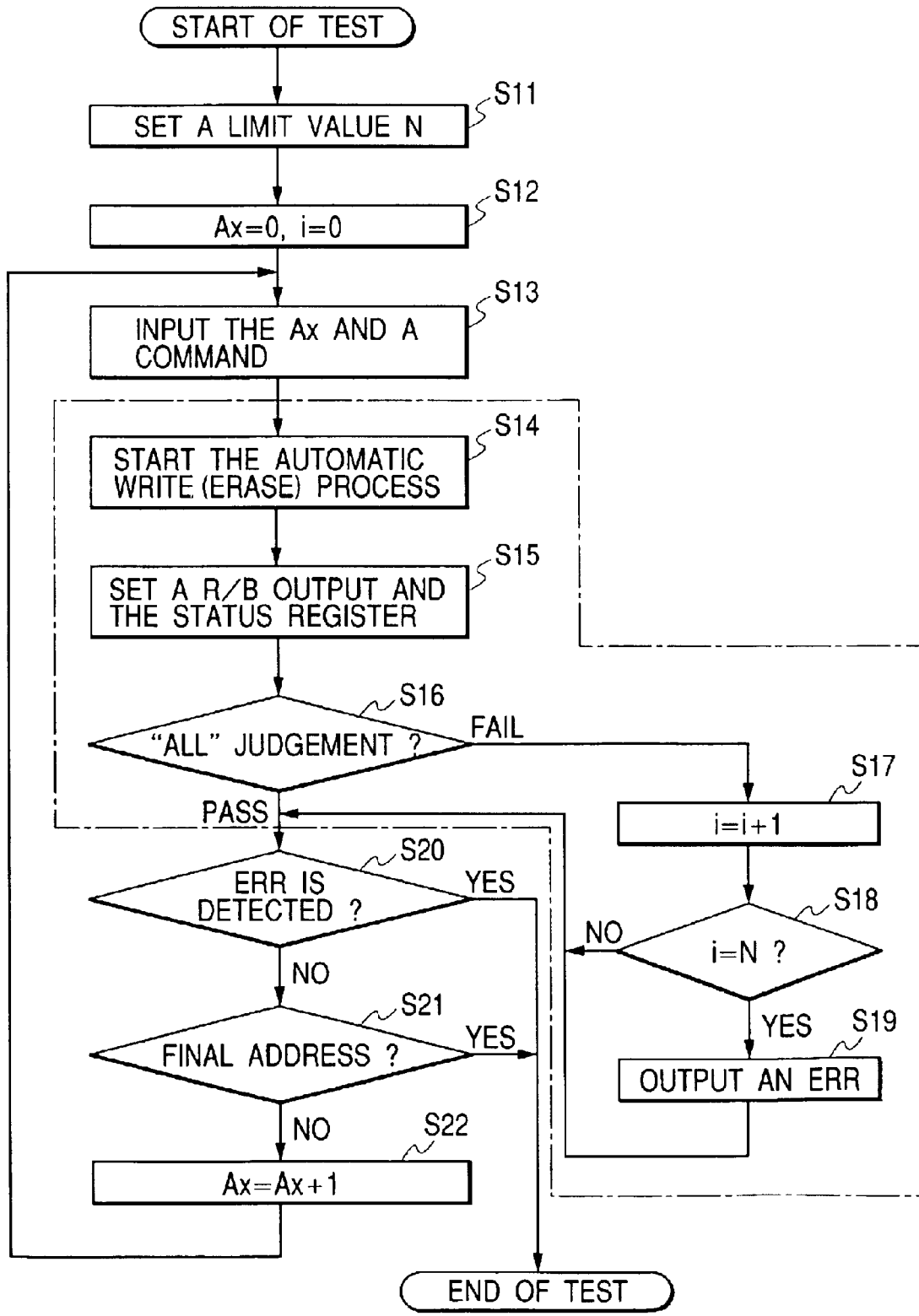
FIG. 4 is a flowchart illustrating an example of procedures of a testing method in the flash memory of the first embodiment.

Next, a test method of flash memory structured as explained above and advantages of this method will then be explained in comparison with the existing test method of flash memory not including the counter circuit 50, comparison circuit 51 and NAND gate circuit 52. FIG. 3 is a flowchart illustrating the existing test method of flash memory, while FIG. 4 illustrates a flowchart of the test method of flash memory of this embodiment. In FIG. 3 and FIG. 4, the processes enclosed within a chain line are executed within the flash memory chip and other processes are executed with a tester for testing the flash memory.

In the existing flash memory test method, an address (sector address) Ax for designating an object of write or erase process is set to the initial value "0" (step S1). This address (address and write data in the case of the write process) and a command are then inputted to the flash memory (step S2). Thereby, a write or erase process is automatically started within the flash memory and the ready/busy terminal R/B is asserted to the low level during the write or erase process. When this process is completed, the ready/busy terminal R/B is set to a high impedance state, pass or fail of the write or erase process is judged with the all written or all erased judging circuit 40, the write error bit or erase error bit of the status register STR is set to the state indicating pass or fail depending on the result of judgment (steps S3, S4).

The tester reads contents of the status register STR by checking the ready/busy terminal R/B and also checks the write error bit or erase error bit. In the case of fail, the address of the relevant sector is stored in a fail memory prepared in the tester (step S5). Next, whether the executed address is the final address or not is judged. When this address is not the final address, the address Ax is updated (+1) and the process returns to the step S2 to repeat the above process (steps S6, S7). When the address is judged as the final address in the step S6, the test is completed, the number of fail sectors in the fail memory is counted up to judge whether it is exceeding the limit value or not in order to determine the pass/fail result of chip (steps S8, S9).

Meanwhile, in the flash memory test method of the embodiment, as illustrated in FIG. 4, a limit value N of fail sector is set first to a register REG within a controller 14. An address (sector address) Ax for designating the write or erase object is set to the initial value "0" (step S12). In this timing, the counted value i of the counter circuit 50 is reset within the flash memory. Next, this address (address and a write data in the case of write process) and a command are inputted to the flash memory (step S13).

Thereby, the write or erase process is automatically executed within the flash memory. When the write or erase process is completed, the all written or all erased judging circuit 40 judges pass or fail of write or erase process. A write error bit or erase error bit of the status register STR is set to the state indicating pass or fail depending on the result of judgment (steps S14, S15). Moreover, the pass or fail state of the write or erase process is judged on the basis of the signal P/F indicating the pass or fail outputted from the all written or all erased judging circuit 40. In the case of fail, the counted value i of the counter circuit 50 is incremented by one (+1) to judge whether the counted value i has reached the limit value N or not (steps S16 to S18). When the comparison circuit 51 judges that the counted value i of the counter circuit 50 has reached the limit value N, this comparison circuit 51 outputs a signal ERR indicating a fail chip (step S19).

Thereby, the tester checks the signal ERR outputted from the flash memory in the step S20. When the signal ERR indicates the fail, the tester stops the test of the relevant chip. When the signal ERR indicates the pass in the judgment of step S20, whether the address is the final address or not is judged in the next step S21. When the address is not the final address, the address Ax is updated (+1) in the step S22 and the process returns to the step S13 to repeat the above processes. When the address is judged as the final address in the step S21, the test of the relevant chip is completed.

As will be apparent from comparison between FIG. 3 and FIG. 4, the test method having introduced the present invention (FIG. 4) can complete the test of the relevant chip when the number of fail sectors has exceeded the limit value because the tester is not required to store the fail sectors into the fail memory and the number of fail sectors can be detected as having exceeded the limit value only by checking the signal (ERR) outputted from the flash memory without counting up the number of fail sectors within the fail memory. Therefore, elongation of the write process time because of this chip can subsequently be prevented.

Otherwise, if a tester which cannot control the continuation/completion of test for every chip is used, the relevant chip in which the number of fail sectors has exceeded the limit value is controlled therein in the execution of the write/erase command. Accordingly, it can be prevented that the relevant chip gives thereafter influence on the test time.

Moreover, when the "1" is set as the limit value N, it is effective to the flash memory in which it is requested that all memory cells can operate. When a value other than "1" is set as the limit value N, it is effective to the flash memory in which the MGM (Mostly Good Memory) management is executed to define the pass state when the number of sectors including the fail memory cells is under the constant value.

Figure 5:
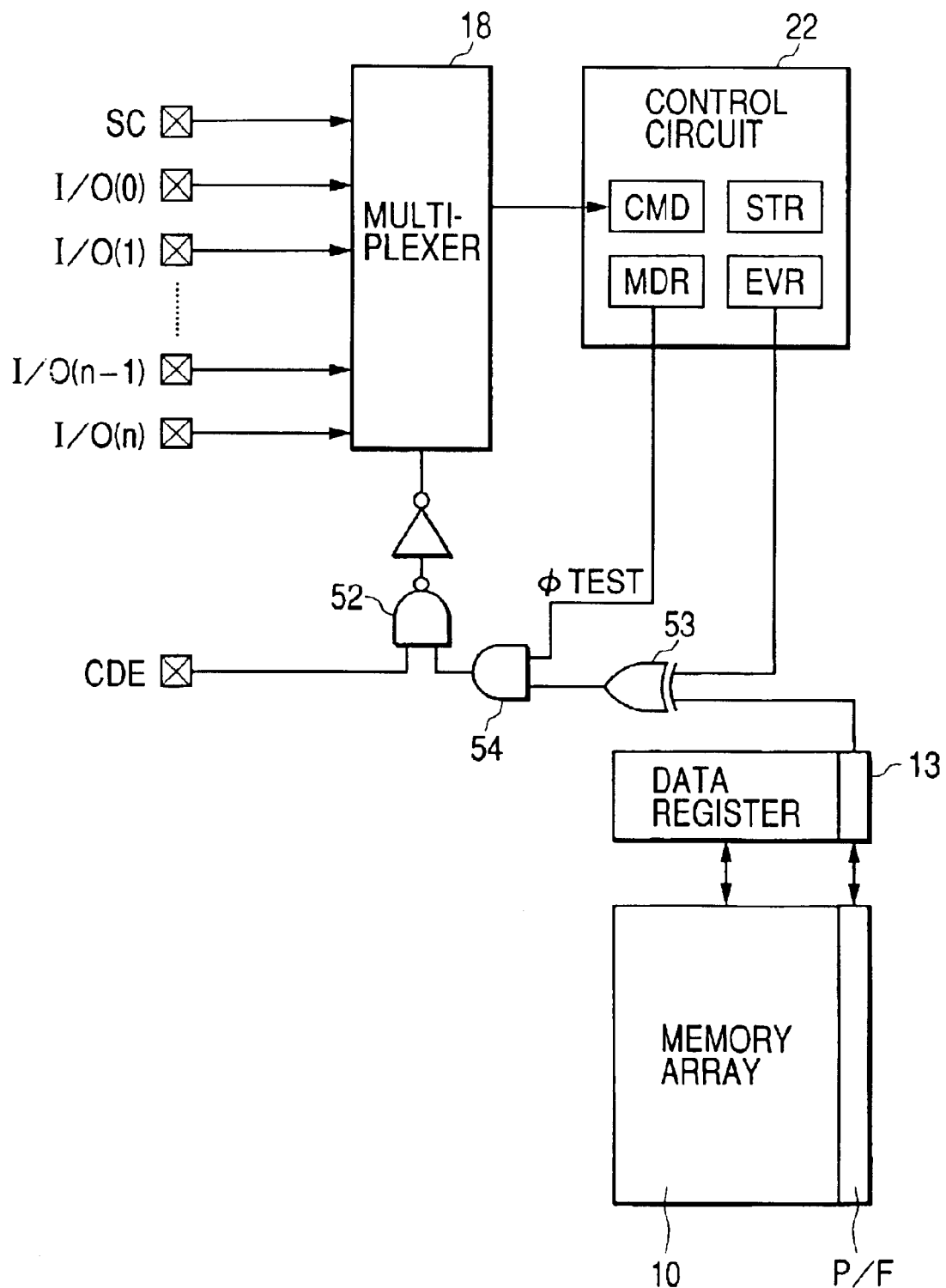
FIG. 5 is a block diagram illustrating a schematic structure of the essential portion of the flash memory to which the second embodiment of the present invention is applied.

Next, the second embodiment of the present invention will be explained. As illustrated in FIG. 5, this second embodiment is provided with a register EVR which holds the bit indicating fail or pass (hereinafter referred to as pass/fail bit) for every sector of the memory array 10 and also holds a read expected value in the controller 22, a comparison circuit 53 such as an exclusive OR gate for comparing the pass/fail bit P/F read from the memory array 10 with the expected value of register EVR and an AND gate 54 for inputting an output of the comparison circuit 53 and a signal Ø TEST of the bit indicating the test condition of the mode register MDR. Thereby, the NAND circuit 52 to which the command enable signal CDE is inputted is controlled with an output of this AND gate 54.

When the test is started with the previous setting of a code indicating fail to the expected value register EVR and the pass/fail bit P/F is matched with the code of the expected value register EVR when a certain sector of memory array is read, the NAND gate 52 is shut off to inhibit the fetching of the command. Moreover, the pass/fail bit P/F is not outputted to the external circuit and the write process from the external circuit of chip is also inhibited. In the test mode, when a write fail or erase fail is detected in the area where the external write or read process of the relevant sector is allowed, the chip is set to the state indicating the fail.

With employment of the structure as explained above, in this second embodiment, the test time required for the second and subsequent tests can be remarkably shortened. The respective test procedures of the first test and the second test will be separately explained with reference to the flowcharts of FIG. 6 and FIG. 7.

Figure 6:
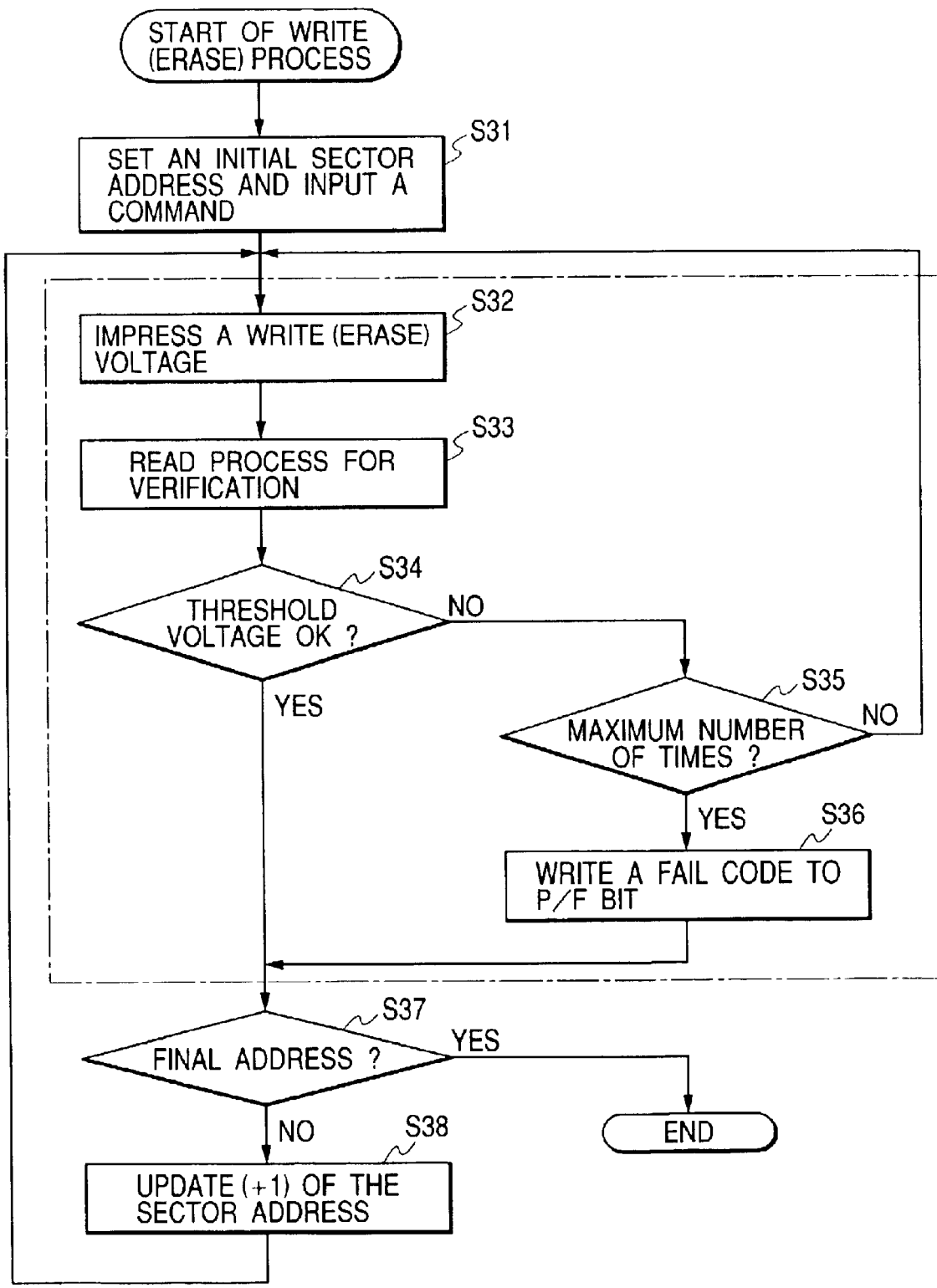
FIG. 6 is a flowchart illustrating procedures of the first test of the flash memory to which the second embodiment is applied.

As illustrated in FIG. 6, in the first test, when the write (or erase) process is started, the first sector address is set and a command is inputted (step S31). In this timing, a write voltage is impressed to the memory cells designated with this sector address (step S32). Next, the read process for verification is executed and a threshold voltage is judged (steps S33, S34). Even if any one of the threshold voltages of the selected memory cells does not reach the verification level, it is judged whether the write (or erase) process has reached the maximum number of times or not (step S35). When the write process is judged not to reach the maximum number of times, the process returns to the step S32 and the write voltage is impressed again to the relevant memory cells. The maximum number of times is set, considering fluctuation of characteristic of memory cells and deterioration of such characteristic, so that the total time, for example, becomes equal to about five times the average time required for the normal memory cells.

When it is judged in the step S35 that the write process has reached the maximum number of times, the process shifts to the step S36 to write the code indicating the fail to the pass/fail bit P/F of the relevant sector. Thereafter, the process goes to the step S37. When it is judged in the step S24 that the threshold voltage of all memory cells has reached the verification level, the process also goes to the step S37 to judge whether the address is the final address or not. When the address is not the final address, the sector address is updated (+1) and the process returns to the step S32 to conduct the write (or erase) process for the next sector (step S38). Meanwhile, when the address is judged as the final address in the step S37, the write (or erase) process is completed.

Figure 7:
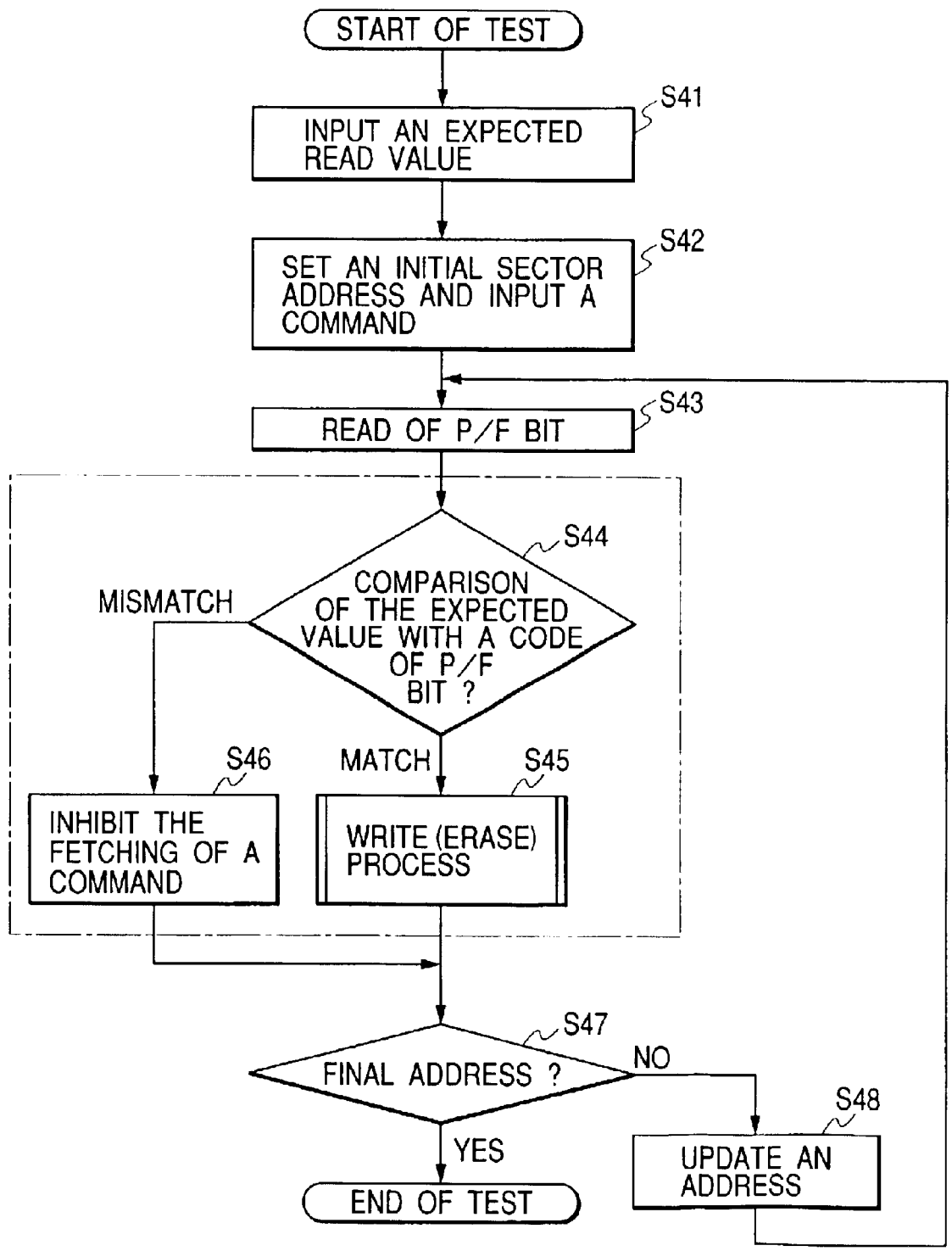
FIG. 7 is a flowchart illustrating procedures of the second and subsequent tests of the flash memory to which the second embodiment is applied.

In the second test, when the write (or erase) process is started as illustrated in FIG. 7, an expected value (in this case, normal code) for the expected value register EVR is set first and the first sector address is then set. The code is then read from the bit P/F of the sector designated with the sector address (steps S41 to S43). The code obtained by the read process is then compared with the expected value. When these are matched, the sector is judged as normal and the write (or erase) process is executed for the selected memory cells (steps S44, S45). The write (or erase) process in the step S45 of this flow corresponds to the steps S32 to S36 in the flow of FIG. 6.

When the write (or erase) process of one sector is completed, the process goes to the step S47 to judge whether the address is the final address or not. Moreover, when the code and the expected value are judged to be mismatched in the step S44, the fetch of the command is inhibited in the step S46 and the judgment is executed in the step S47. When the address is not the final address, the address is updated in the step S48 and the process is returned to the step S43 to perform the write (or erase) process to the next sector. Meanwhile, when the address is judged to have reached the final address in the steps S47, the write (or erase) process is completed.

In this flow, the code read from the pass/fail bit P/F is compared with the expected value in the step S44. When these are mismatched, namely when the relevant sector is judged to be the fail sector, the write (or erase) process is not executed. Therefore, repetition of useless write (or erase) process is prevented. Accordingly, on the occasion of simultaneously testing a plurality of chips like the wafer test, it can be prevented that the tests of the other normal chips are placed in the waiting condition because of the chip which intrinsically has the sectors including the fail bits.

In this second embodiment, the pass/fail bit P/F provided in the memory array is not restricted to one bit and it is also possible that the pass/fail bit P/F is formed of a plurality of bits and the sector of which fail is detected with a matching test wherein "0" is written to all bits and thereafter "1" is written and the sector of which fail is detected with a test to write the alternate pattern of "0" and "1" called the checker pattern is written are discriminated with a code and are then stored.

Moreover, in this embodiment, it is explained that the pass/fail bit P/F is provided for each sector, but it is also possible to provide the pass/fail bit P/F indicate the pass and fail for every block may be provided in the flash memory in which the write process and erase process are executed simultaneously in unit of a plurality of sectors called the block. In addition, the pass/fail bit P/F is provided in the register or RAM in place of providing the pass/fail bit P/F to a part of the memory array 10 consisting of nonvolatile memory element.

Furthermore, in this embodiment, comparison with the expected value is executed with the pass/fail bit P/F but it is also possible to execute the comparison in the area where usual read and write processes are possible.

Next, a modification of the second embodiment will be explained. This modification example is provided with a function to automatically write, by no means of the tester, the code which is called as the MGM (Mostly Good Memory) and indicates the pass state to the sector management area of the memory array when the predetermined command is inputted using the information of the pass/fail bit P/F indicating the pass/fail state provided in the memory array.

Application of this modification example not only makes unnecessary for the tester to provide a fail memory to store the address of fail sector but also automatically enables the write process of the MGM code in parallel in a plurality of chips while it has been requested that the write process of the existing MGM code using the fail memory is executed chip by chip with the tester. Accordingly, it is possible to attain an advantage that the test time can be shortened remarkably.

Figure 9:
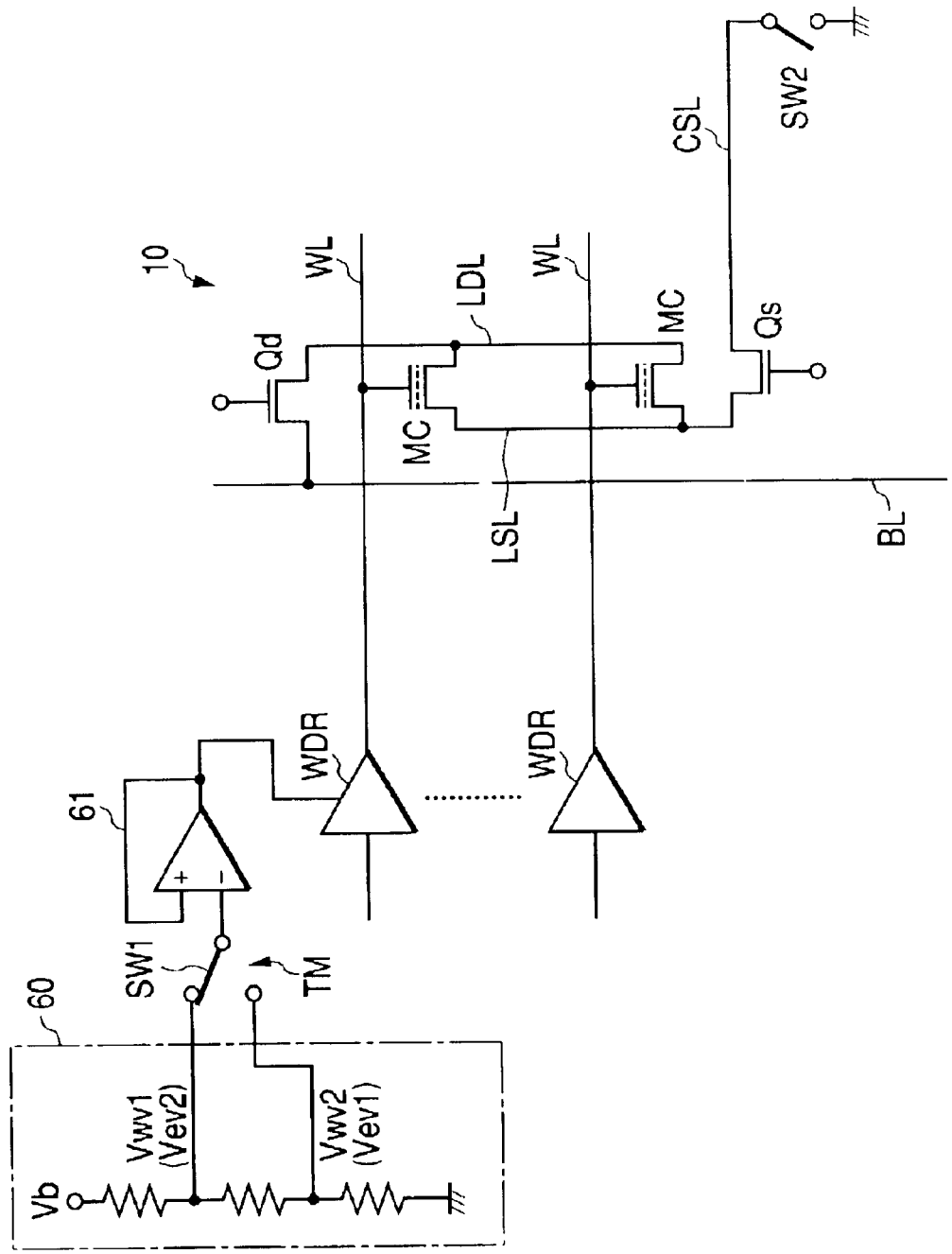
FIG. 9 is a circuit configuration diagram illustrating an example of a verification level switching system of the flash memory to which the third embodiment of the present invention is applied.

Next, the third embodiment of the present invention will be explained. As illustrated in FIG. 8, this third embodiment is provided with a verification judging level Vwv2 for judging the test in addition to the usual verification judging level Vwv1. Here, in the flash memory of the structure that the threshold voltage of nonvolatile memory element is raised with the write process and the threshold voltage is lowered with the erase process, the verification judging level Vwv2 for judging the test is set lower than the usual verification judging level Vwv1. FIG. 9 illustrates a practical structure example for switching the verification judging levels Vwv1/Vwv2.

In FIG. 9, MC designates a memory cell consisting of MOSFET (nonvolatile memory element) having a control gate and a floating gate; WL, a word line connected to the control gate of the nonvolatile memory element (or to form a gate electrode); WDR, a word driver to drive the word line to the selection level.

This third embodiment is provided with a resistor dividing circuit 60 for generating the verification judging levels Vwv1 and Vwv2 by dividing, with a resistor, a voltage Vb raised to the level higher than the verification judging level Vwv1, a switch SW1 for selecting any one of the verification judging levels Vwv1 and Vwv2 generated with the resistor dividing circuit 60 and a voltage follower 61 for supplying the selected voltage to the word driver WDR as the power supply voltage through the impedance conversion. The switch SW1 may be controlled, for example, to switch the voltage to be transferred on the basis of the signal TM of the bit indicating the test mode, for example, of the mode register MDR.

The verification judging level Vwv2 explained above is set to a value which is lower than the changing voltage, due to the single write pulse, of the threshold voltage of the normal memory cells with least change (lower skirt of the threshold voltage distribution D1 of the first write process in FIG. 8) but is higher than an initial threshold voltage level (upper skirt of the threshold voltage distribution D0 of the memory cell in the erased condition). In FIG. 9, only the potentials Vwv1 and Vwv2 required for explanation of this embodiment are indicated but the verification judging levels Vev1, Vev2 in the erase process and usual read-out level are also formed in addition to such potentials and are then supplied to the word driver circuit WDR.

Here, FIG. 9 illustrates an example of the memory array in an AND type flash memory in which the sources and drains of a plurality of memory cells are respectively connected to a local source line LSL and a local drain line LDL and the local source line LSL is connected to a common source line CSL via the selected MOSFET Qs and moreover connected to the connecting point via the switch SW2. Moreover, the local drain line LDL can be connected to a main bit line BL via the selected MOSFET Qd. The selected MOSFETs Qs and Qd corresponding to the selected word line is controlled for ON and OFF in the predetermined timing with the X-decoder.

Although not illustrated in FIG. 9, a flip-flop type sense/latch circuit having a sense amplifier function to amplify a potential of bit line and a data holding function is connected for every bit line at one end of the bit line BL. Moreover, the sense/latch circuit is also provided with a discharge means for discharging a switch element for electrically connecting or separating the corresponding bit lines and also discharging the bit line. In addition, the sense/latch circuit is also provided with an inversion circuit for inverting the logic of the data on the bit line. With provision of such inversion circuit, even when the logic of the write data and the logic of the data read from the memory cell are inverted with each other, the data on the bit line can be inverted.

Although not particularly restricted, in the flash memory of this embodiment, a positive high voltage (for example, +16V) is applied to the word line WL (control gate) during the write process and a negative charge is implanted to the floating gate of the memory cell to raise the threshold voltage thereof. Therefore, the bit line BL connected to the memory cell (for example, data "1") which is requested to raise the threshold voltage is not precharged, namely set to 0V depending on the write data. Meanwhile, the bit line BL connected to the memory cell (for example, data "0") which is not requested to raise the threshold voltage is precharged to 5.5V. On the occasion of write process, the source of each selected memory cell is floated (opened).

During the data erase process, a negative high voltage (for example, −16V) is applied to the word line WL (control gate) and 0V is also applied to the bit line BL and local source line LSL. Thereby, the negative charge is extracted from the floating gate of the memory cell to lower the threshold voltage thereof. FIG. 9 illustrates, as an example, the structure of the so-called AND type flash memory, but the present invention is not limited to such structure and can also be applied to a so-called NOR type flash memory in which a plurality of memory cells are connected in series.

Figure 10:
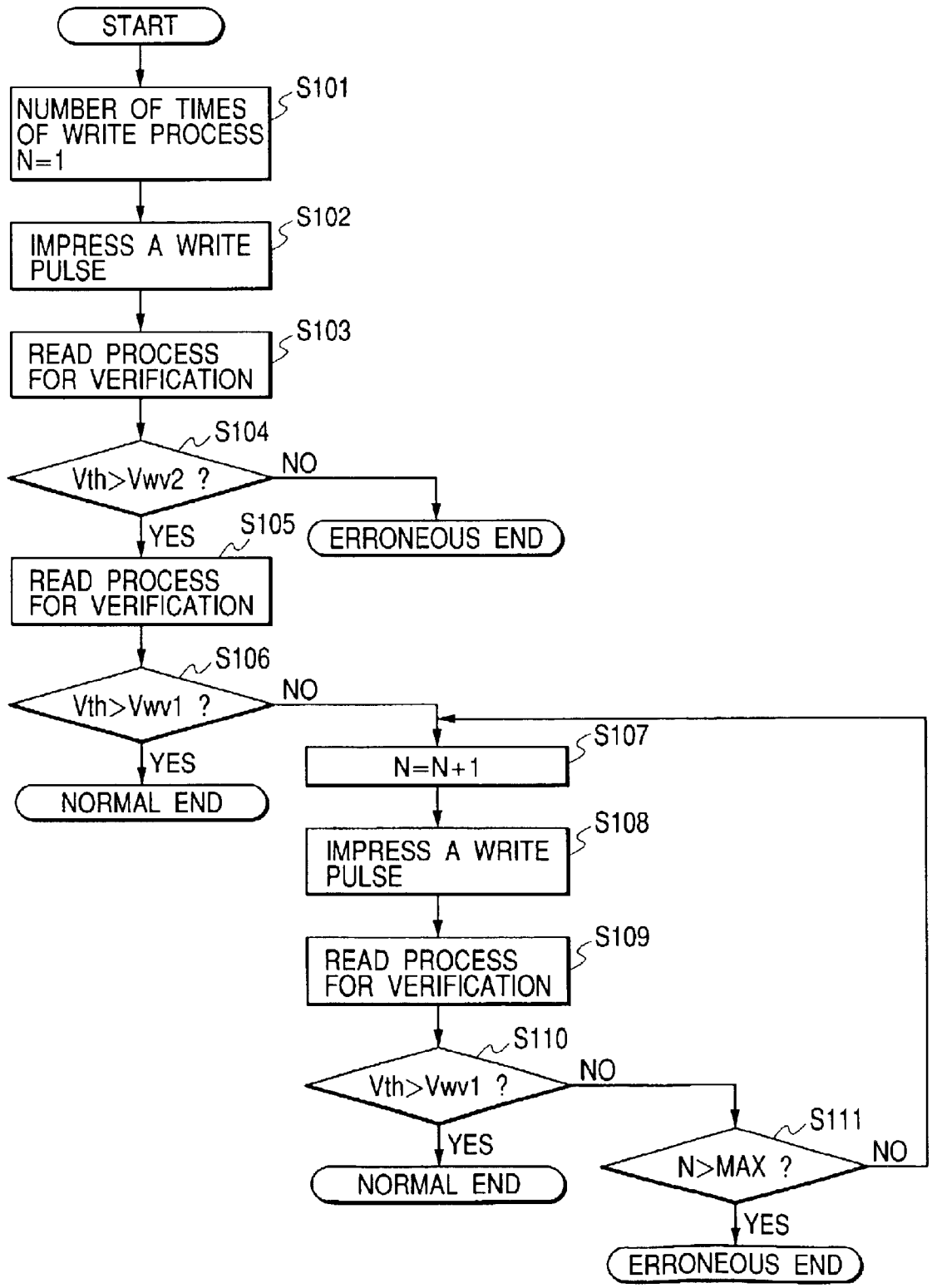
FIG. 10 is a flowchart illustrating procedures of the write process of the flash memory to which the third embodiment of the present invention is applied.

FIG. 10 illustrates procedures of the write process in the test mode in the flash memory to which the third embodiment is applied. This flow illustrates procedures of the write process in the write unit such as one sector which is executed with the single supply of the command and address.

When the write process is started, a value N of the counter for counting the number of times of write process is set first to "1" and then the write pulse is applied to the selected memory cells (steps S101, S102). Next, the verification judging level is set to Vwv2 to execute the read process for verification from the sector to which the data is written in order to judge whether the threshold voltage Vth has changed exceeding Vwv2 or not (steps S103, S104). Here, when a certain threshold voltage is judged not to reach the level Vwv2, the write check bit of the status register STR is set to "1" (=fail) and the write process is completed.

On the other hand, when it is judged in the step S104 that the threshold voltage Vth of all memory cells of the selected sector has changed exceeding the level Vwv2, the process moves to the step S105 to set the judging level for verification is set to Vwv1 and the data read process is executed for verification in order to judge whether the threshold voltage Vth has changed exceeding the level Vwv1 or not (step S106). Here, when the threshold voltage Vth of all memory cells of the selected sector has been judged to have changed exceeding the level Vwv1, the write check bit of the status register STR is set to "0" (=pass) and the write process of the relevant sector is completed.

When a certain threshold voltage is judged not to have reached the level Vwv1 in the step S106, the process goes to the step S107 to update (+1) the value N of the counter for counting the number of times of write process and then to impress the write pulse to the selected memory cells (step S108). Next, the verification judging level is set to Vwv1 to read the data for verification from the sector to which the data is written in order to judge whether the threshold voltage Vth has changed exceeding the level Vwv1 or not (steps S109, S110). Here, when a certain threshold voltage is judged not to have reached the level Vwv1, the process goes to the step S111 to judge whether the number of times of write process has reached the preset maximum value Max or not. When N>Max, the write check bit of the status register STR is set to "1" (=fail) and the write process is completed.

When the number of times of write process is judged not to have reached the maximum value Max in the step S111, the process returns to the step S107 to update the value N of the counter for counting the number of times of write process and then to repeat the operations to impress again the write pulse to the memory cell. Moreover, when the threshold voltage Vth of all memory cells of the selected sector is judged to have changed exceeding the level Vwv1, the write check bit of the status register STR is set to "0" (=pass) and the write process of the relevant sector is completed. Moreover, when the write process is completed, the ready/busy signal R/B is changed to the state to accept the command.

According to this third embodiment, when a fail bit is included in the selected sector and a certain threshold voltage does not exceed the level Vwv2 in the first write process as illustrated in FIG. 8(B), it is judged as a write error and the write process in the chip is immediately stopped. Therefore, on the occasion of testing simultaneously a plurality of chips like the wafer test, it can be prevented that the test of the other normal chips is placed in the waiting condition due to the chips having a sector including fail bits.

As illustrated in FIG. 11, the erase process in this embodiment is executed by setting the verification judging level Vev2 for test judgment in addition to the usual verification judging level Vev1. Here, the verification judging level Vev2 for test judgment is set to a value (relatively lower value) which is higher than the usual verification judging level Vev1. In more practical, the verification judging level Vev2 is set to a value which is higher than changing voltage, due to the single erase pulse, of the threshold voltage of the normal memory cell with least change (upper skirt of the threshold voltage distribution of the first erase process of FIG. 11) but is lower than the initial threshold voltage level (lower skirt of the threshold voltage distribution of the memory cells in the write process condition).

The switching of the erase verification judging levels Vev1 and Vev2 is performed with the same structure as the write verification of FIG. 9 and the ease test process is performed with the same procedures as the write test of FIG. 10. Therefore, the practical explanation will be eliminated here. Therefore, on the occasion of simultaneously testing a plurality of chips in the erase test as in the case of the write process, it can be prevented that the erase test of the other normal chips is placed in the waiting condition due to the chip having the sector including fail bits.

The present invention has been explained based on the preferred embodiments but the present invention is not limited to above embodiments and allows various changes and modifications within the scope not departing from the claims of the present invention. For example, in the embodiments, the mode register MDR, limit value setting register REG, read expected value setting register EVR are all provided in the controller 22 but it is also possible to introduce the individual circuits in separation from the controller 22.

Moreover, in above embodiments, the present invention is applied to a two-level flash memory in which 1-bit data is stored in one memory element, but the present invention can also be applied to a multi-level flash memory in which 2 bits or more bits data are stored in one memory element.

In addition, in above embodiments, a redundant circuit for relieving fail memory cells is not explained but the present invention can also be applied to the flash memory having the fail relief function using the redundant circuit. Namely, the present invention is also effective for the test after relieving the redundant circuit as well as the test before relieving the redundant circuit. However, the present invention can be more effectively applied to the test after relieving the redundant circuit.

In above explanation, the present invention has been applied to the flash memory which is an application field as the background of the invention, but the present invention is not limited thereto. Namely, the present invention can be widely applied to a semiconductor memory device including nonvolatile memory element which stores information by applying a voltage and then changing a threshold voltage.

The present invention can provide following effects that the test time can be shortened and thereby can lower the unit price of chip in the electrical programmable and erasable nonvolatile semiconductor memory device such as a flash memory in which it can be eliminated, in the case where a plurality of memories are tested simultaneously, that the other normal memories which have completed the write or erase process are placed in the condition to wait for the continuation of test due to the repeated write or erase process in the memories having fails.

What is claimed is:

1. A nonvolatile semiconductor memory device comprising:
   a memory array including a plurality of nonvolatile memory elements;
   a counter circuit that counts a fail count in a write operation or in an erase operation;
   a register that sets an allowable value of the fail count;
   a comparison circuit that compares said allowable value with said fail count; and
   a plurality of external terminals,
   wherein each of said nonvolatile memory elements is capable of storing information by executing said write operation or by executing said erase operation,
   wherein a first external terminal of said plurality of external terminals is for inputting a command code that specifies an arbitrary one of operations of said nonvolatile semiconductor memory device,
   wherein said write operation is specified by inputting a first command code from said first external terminal, and said erase operation is specified by inputting a second command code from said first external terminal,
   wherein when said fail count has exceeded the allowable value, neither of said write operation nor said erase operation are executed, even if said first command code or said second command code is input from said first external terminal,
   wherein an address signal is input from said first external terminal,
   wherein a second external terminal of said plurality of external terminals inputs a control signal which indicates whether the first external terminal is a inputting said command code or said address signal, and
   wherein an input of said control signal inputted from said second external terminal is inhibited by an output signal of said comparison circuit.

2. A nonvolatile semiconductor memory device according to claim 1, wherein said output signal of said comparison circuit is outputted from a third external terminal of said plurality of external terminals.

3. A nonvolatile memory apparatus comprising:
   a memory array;
   a control circuit; and
   a plurality of external terminals,
   wherein said control circuit comprises a counter circuit, a compare circuit and a register,
   wherein said memory array comprises a plurality of memory cells, each of which is capable of storing information and erasing information,
   wherein said plurality of external terminals comprises a first terminal and a second terminal,
   wherein said first terminal receives commands that specify arbitrary ones of operations of said nonvolatile memory apparatus,
   wherein said commands include a program command and an erase command,
   wherein said control circuit controls a program operation in accordance with said program command to store information in a plurality of memory cells to be programmed, and an erase operation in accordance with said erase command to erase information stored a plurality of said memory cells to be erased,
   wherein said counter circuit counts a program fail, where one or more of said memory cell, to be programmed fail to store information in said program operation, or an erase fail, where one or more of said memory cells to be erased fail to erase information in said erase operation, said compare circuit compares the count of said program fail or said erase fail to a predetermined value registered in said register, and said control circuit stops said program operation or said erase operation and outputs a first signal via said second external terminal if said count of the program fail or the erase fail is over said predetermined value.

4. A nonvolatile memory apparatus according to claim 3, wherein said first terminal is capable of receiving an address information with said program command or said erase command, and
   wherein said control circuit selects nonvolatile memory cells to be programmed or erased in accordance with said address information.

5. A nonvolatile memory apparatus according to claim 4, wherein each of said nonvolatile memory cells has a threshold voltage,
   wherein said control circuit controls moving threshold voltages of all of said memory cells to be erased to within a first voltage range in said erase operation, and
   wherein said control circuit controls moving threshold voltages of said memory cells to be programmed to within a second voltage range in accordance with information to be stored in said program operation.

6. A nonvolatile memory apparatus according to claim 5, wherein a program fail is counted when said threshold voltage of one of said memory cells to be programmed fails to move to within said second voltage range, and
   wherein an erase fail is counted when said threshold voltage of one of said memory cells to be erased fails to move to within said first voltage range.

* * * * *